Dec. 27, 1966 AKIRA YOKOTA 3,294,600

METHOD OF MANUFACTURE OF SEMICONDUCTOR ELEMENTS

Filed Nov. 14, 1963

INVENTOR.
AKIRA YOKOTA
BY Hopgood & Calimafde
ATTORNEYS 3,294,600

METHOD OF MANUFACTURE OF SEMICONDUCTOR ELEMENTS

Akira Yokota, Tokyo, Japan, assignor to Nippon Electric Company Limited, Tokyo, Japan, a corporation of Japan Filed Nov. 14, 1963, Ser. No. 323,834
Claims priority, application Japan, Nov. 26, 1962, 37/53,079
4 Claims. (Cl. 148—177)

This invention relates to the manufacture of semiconductor elements and is particularly useful in the manufacture of mesa type semiconductor diode elements.

In planar type silicon semiconductor elements having a PN junction coated with silicon oxide film, it is necessary to form an electrode mound on the element prior to diode assembly because it is plane in shape. The methods presently used for forming such mounds, which include thermo compression bonding of gold balls and plating, involve a problem of weakness in fixing the material in place, deterioration of characteristics, and require a number of difficult processes. Additionally, the distortion of the electric field about the outer surface of the PN junction sometimes presents a problem of voltage breakdown.

In the case of ordinary alloy type silicon diodes having no oxide film it is common practice to form a PN junction by alloying an aluminum wire, and to use this wire as an electrode. With such a method, however, it is difficult to produce a uniform area and depth of the PN junction, and non-uniform characteristics therefore often result. In the case of variable capacitance diodes which are enjoying continued commercial acceptance, the increased applied power requires that the diodes have a higher voltage breakdown, larger capacitance and a higher rate of capacitance change to voltage. Generally the PN junction of such diodes is formed by the alloy method. However by using the alloy method which employs an aluminum wire as described above, local non-uniformity of alloy may occur and it becomes very difficult to control the area, depth and uniformity of the alloy when the area is large.

Accordingly, it is an object of this invention to eliminate the prior art disadvantages referred to above.

All of the objects, features and advantages of this invention and the manner of attaining them will become more apparent and the invention itself will be best understood by reference to the following description of an embodiment of the invention taken in conjunction with the accompanying drawing, in which—

Figure 3:
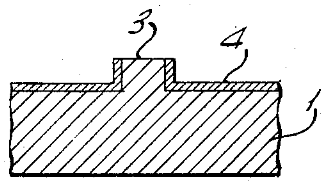
Figure 4:
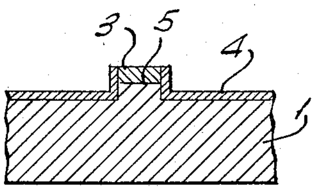
Figure 5:
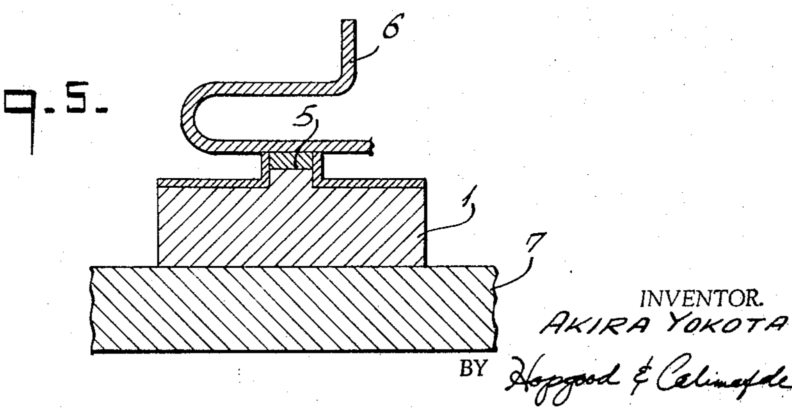

FIGS. 1, 2, 3 and 4 are sectional views illustrating different steps during manufacture of a semiconductor element in accordance with the invention, and FIG. 5 shows a diode formed with a semiconductor element made according to the invention.

Figure 1:
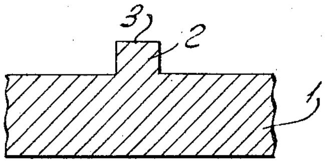
Figure 2:
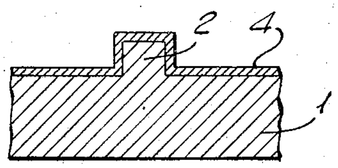

Referring now to FIG. 1, the pedestal 3 of an N type silicon wafer 1 is coated with a suitable wax, which is later removed after etching. The wafer is then heated to about 1150° C. in a wet oxygen or steam atmosphere to deposit an oxide film 4 of the desired thickness, as shown in FIG. 2. After this a photoresistive emulsion such as that marketed by the Kodak Company and known as emulsion K.P.R. is coated on the wafer 1 except for the pedestal surface 3 of the mesa portion 2. The oxide film on the pedestal surface 3 is then removed by etching with, for example, an ammonium fluoride solution. The result of this process is as shown in FIG. 3, which shows the pedestal 3 after removal of the oxide film therefrom.

Next a PN junction 5 is formed as shown in FIG. 4. In the case of an alloy type junction, aluminum is first deposited by evaporation in a vacuum. This evaporation process is carried out while heating the wafer at about 600° C. in the vacuum, resulting in the advantage that the alloy forms or progresses very uniformly from the pedestal surface 3 and is prevented from progressing non-uniformly along the side surfaces of the mesa portion 2 because these side surfaces are covered by the oxide film 4. The aluminum which is deposited on the oxide film 4 is prevented by this film from forming an alloy with the wafer 1. This deposited aluminum on the oxide layer 4 is later removed. In the case of a diffusion type junction, boron, for example, may be used to diffuse from the pedestal surface 3. During this process, no PN junctions will be formed in places coated with the oxide film since such film has a masking effect against boron as is well known. Furthermore, the boron will progress very uniformly to form the PN junction 5. The wafer 1 is preferably a large sheet of semiconductor material with a plurality of mesa portions 2 treated to form the PN junctions as described above. Thereafter the sheet is cut into a number of pieces to provide a plurality of individual semiconductor elements each having a PN junction.

FIG. 5 shows such a semiconductor element 1' being assembled as a diode, where the numeral 6 designates the contact electrode and 7 is the other electrode.

The semiconductor element obtained in accordance with the present invention requires no preliminary mound as described at the beginning of the specification because it is a mesa type. In addition it is stable against the external atmosphere because of the oxide film and there is no distortion of the electrical field because the PN junction is plane in shape.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A method for making semiconductor elements comprising the steps of
- providing a plurality of mesa shaped portions on one side of a wafer of semiconductor material,
- providing an oxide film of predetermined thickness on said side of said wafer so that said film covers the exposed portions of said side,
- coating a photoresistive emulsion on said side of said wafer so that said emulsion covers the exposed portions of said side except for the top surfaces of said mesa portions,
- etching said top surfaces with a solution of ammonium fluoride to remove said oxide film therefrom,
- and depositing aluminum on said top surfaces while heating said wafer in a vacuum to form alloy type PN junctions of planar shape adjacent the top surfaces of said mesa portions.

2. A method for making semiconductors by mass production comprising the steps of
- providing a plurality of mesa shaped portions on one side of a wafer of semiconductor material,
- heating said wafer to approximately 1150° C. in an oxidizing atmosphere to deposit an oxide film of predetermined thickness on one side of said wafer,
- coating a photoresistive emulsion on said side of said wafer so that said emulsion covers the exposed portions of said side except for the top surfaces of said mesa portions,
- etching said top surfaces with a solution of ammonium fluoride to remove said oxide film therefrom,
- depositing aluminum on said top surfaces while heating said wafer to approximately 600° C. in a vacuum to form alloy type PN junctions of planar shape in the upper regions of said mesa portions, and severing said wafer to provide a plurality of individual semiconductor elements each having a PN junction.

3. A method for making semiconductor elements comprising the steps of providing a plurality of mesa shaped portions on one side of a wafer of semiconductor materials, heating said wafer in an oxidizing atmosphere to produce an oxide film of predetermined thickness on said side of said wafer so that said film covers the exposed portions of said side, coating a photoresistive emulsion on said side of said wafer so that said emulsion covers the exposed portions of said side except for the top surfaces of said mesa portions, etching said top surfaces with a solution of ammonium fluoride to remove said oxide film therefrom, depositing boron on said top surfaces while heating said wafer in a vacuum to form diffusion type PN junctions of planar shape adjacent the top surfaces of said mesa portions, and severing said wafer to provide a plurality of individual semiconductor elements each having a PN junction.

4. A method for making semiconductors comprising the steps of providing a plurality of mesa shaped portions on one side of a wafer of semiconductor material, heating said wafer to approximately 1150° C. in an oxidizing atmosphere to deposit an oxide film of predetermined thickness on one side of said wafer, coating a photoresistive emulsion on said side of said wafer so that said emulsion covers the exposed portions of said side except for the top surfaces of said mesa portions, etching said top surfaces with a solution of ammonium fluoride to remove said oxide film therefrom, depositing boron on said top surfaces while heating said wafer to approximately 600° C. in a vacuum to form diffusion type PN junctions of planar shape in the upper regions of said mesa portions, and severing said wafer to provide a plurality of individual semiconductor elements each having a PN junction.

References Cited by the Examiner

UNITED STATES PATENTS

| | | | |
|---|---|---|---|
| 2,825,667 | 3/1958 | Mueller | 148—179 |
| 2,906,647 | 9/1959 | Roschen | 148—179 |
| 3,042,565 | 7/1962 | Lehovec | 148—177 |
| 3,098,954 | 7/1963 | Misra | 148—177 |

HYLAND BIZOT, *Primary Examiner.*

DAVID L. RECK, *Examiner.*

R. O. DEAN, *Assistant Examiner.*